(12) United States Patent
Kurz et al.

(10) Patent No.: US 8,962,420 B2
(45) Date of Patent: Feb. 24, 2015

(54) SEMICONDUCTOR DEVICE COMPRISING A BURIED POLY RESISTOR

(75) Inventors: Andreas Kurz, Dresden (DE); Roman Boschke, Dresden (DE); James Buller, Austin, TX (US); Andy Wei, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 980 days.

(21) Appl. No.: 12/553,475

(22) Filed: Sep. 3, 2009

(65) Prior Publication Data

US 2010/0078645 A1    Apr. 1, 2010

(30) Foreign Application Priority Data

Sep. 30, 2008 (DE) .......................... 10 2008 049 732

(51) Int. Cl.
| | |
|---|---|
| *H01L 21/8234* | (2006.01) |
| *H01L 21/8244* | (2006.01) |
| *H01L 27/06* | (2006.01) |
| *H01L 21/84* | (2006.01) |
| *H01L 27/12* | (2006.01) |
| *H01L 49/02* | (2006.01) |

(52) U.S. Cl.
CPC ............ *H01L 27/0629* (2013.01); *H01L 21/84* (2013.01); *H01L 27/1203* (2013.01); *H01L 28/20* (2013.01)
USPC ................................... 438/238; 257/E27.016

(58) Field of Classification Search
CPC ........................................................ H01L 28/20
USPC ................................... 438/238; 257/E27.016
See application file for complete search history.

(56) References Cited

U.S. PATENT DOCUMENTS

| | | | | |
|---|---|---|---|---|
| 4,418,469 | A | | 12/1983 | Fujita ............................... 29/577 |
| 5,240,511 | A | * | 8/1993 | Kapoor ......................... 148/33.2 |
| 5,466,963 | A | * | 11/1995 | Beasom ......................... 257/516 |
| 5,864,162 | A | | 1/1999 | Reedy et al. .................. 257/379 |
| 6,501,153 | B2 | | 12/2002 | Oue et al. ...................... 257/625 |
| 7,341,883 | B2 | * | 3/2008 | Park et al. ........................ 438/46 |
| 2003/0160715 | A1 | * | 8/2003 | Maeda et al. ................. 341/144 |
| 2010/0078727 | A1 | * | 4/2010 | Min et al. ...................... 257/369 |

FOREIGN PATENT DOCUMENTS

DE      689 29 504 T2     9/2004 ............. H01L 21/76

OTHER PUBLICATIONS

Translation of Official Communication from German Patent Office for German Patent Application No. 10 2008 049 732.0-33 dated Sep. 25, 2009.
Translation of Official Communication from German Patent Office for German Patent Application No. 10 2008 049 732.0 dated Jul. 7, 2010.

* cited by examiner

*Primary Examiner* — Hsin-Yi Hsieh
(74) *Attorney, Agent, or Firm* — Amerson Law Firm, PLLC

(57) ABSTRACT

An embedded or buried resistive structure may be formed by amorphizing a semiconductor material and subsequently re-crystallizing the same in a polycrystalline state, thereby providing a high degree of compatibility with conventional polycrystalline resistors, such as polysilicon resistors, while avoiding the deposition of a dedicated polycrystalline material. Hence, polycrystalline resistors may be advantageously combined with sophisticated transistor architectures based on non-silicon gate electrode materials, while also providing high performance of the resistors with respect to the parasitic capacitance.

16 Claims, 4 Drawing Sheets

US 8,962,420 B2

SEMICONDUCTOR DEVICE COMPRISING A BURIED POLY RESISTOR

BACKGROUND OF THE INVENTION

1. Field of the Invention

The present disclosure generally relates to the field of fabricating integrated circuits, and, more particularly, to resistors provided in the semiconductor layer in complex integrated circuits.

2. Description of the Related Art

In modern integrated circuits, a very high number of individual circuit elements, such as field effect transistors in the form of CMOS, NMOS, PMOS elements, resistors, capacitors and the like are formed on a single chip area. Typically, feature sizes of these circuit elements are steadily decreasing with the introduction of every new circuit generation, to provide currently available integrated circuits with an improved degree of performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance.

In addition to the large number of transistor elements, a plurality of passive circuit elements, such as capacitors and resistors, are typically formed in integrated circuits as required by the basic circuit layout. Due to the decreased dimensions of circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC).

Although transistor elements are the dominant circuit element in highly complex integrated circuits which substantially determine the overall performance of these devices, other components, such as capacitors and resistors, may be required, wherein the size of these passive circuit elements may also have to be adjusted with respect to the scaling of the transistor elements in order to not unduly consume valuable chip area. Moreover, the passive circuit elements, such as the resistors, may have to be provided with a high degree of accuracy in order to meet tightly set margins according to the basic circuit design. For example, even in substantially digital circuit designs, corresponding resistance values may have to be provided within tightly set tolerance ranges so as to not unduly contribute to operational instabilities and/or enhanced signal propagation delay. For example, in sophisticated applications, resistors may frequently be provided in the form of "integrated polysilicon" resistors which may be formed above the semiconductor layer and/or respective isolation structures so as to obtain the desired resistance value without significantly contributing to parasitic capacitance, as may be the case in "buried" resistive structures which may be formed within the active semiconductor layer. A typical polysilicon resistor may, thus, require the deposition of the basic polysilicon material, which may frequently be combined with the deposition of a polysilicon gate electrode material for the transistor elements. During the patterning of the gate electrode structures, the resistors may also be formed, the size of which may significantly depend on the basic specific resistance value of the polysilicon material and the subsequent type of dopant material and concentration that may be incorporated into the resistors to adjust the resistance values.

Due to the ongoing shrinkage of the critical dimensions of transistors, sophisticated materials for the corresponding gate electrode structures may be used, such as high-k dielectric materials for the gate insulation layers, in combination with non-polysilicon materials, such as metal-containing materials, thereby typically requiring sophisticated manufacturing regimes. For example, frequently, the deposition of a polysilicon material may no longer be required for providing sophisticated gate electrode structures so that the formation of corresponding polysilicon resistors above the basic semiconductor material may be associated with additional deposition processes, which in turn may not be compatible with the sophisticated manufacturing strategies in forming high-k metal gate electrode structures or which may at least contribute to a significant additional complexity or at least reduced flexibility of the entire manufacturing flow.

On the other hand, providing buried resistors, which may typically be formed below respective active regions of transistor elements and the like or which may be formed in the basic semiconductor material in dedicated resistor regions, may have an increased parasitic capacitance due to any adjacent semiconductor materials or active regions, thereby contributing to increased signal propagation delay, which may frequently not be compatible with device requirements of sophisticated semiconductor devices, in which high-k metal gate electrode structures may be implemented in order to enhance overall device performance. That is, combining conventional buried resistor structures, which may typically be associated with a high parasitic capacitance with sophisticated transistor elements based on non-polysilicon gate electrode materials, may be less than desirable in view of overall device performance.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and techniques for forming the same in which enhanced flexibility in forming resistive structures may be obtained, for instance in view of a combination with sophisticated gate electrode structures, by providing a "buried" resistive structure while substantially avoiding or at least significantly reducing the parasitic capacitance while substantially maintaining a high degree of compatibility with conventional polycrystalline resistors. To this end, the resistive structure may be formed in a specified semiconductor region of an initially crystalline semiconductor layer, wherein the semiconductor region may be appropriately enclosed by a dielectric material, such as silicon dioxide, in order to reduce a capacitive coupling to any adjacent semiconductor areas. Moreover, the entire semiconductor region may be amorphized prior to introducing an appropriate dopant species and may be subsequently annealed to obtain a polycrystalline semiconductor material having an enhanced dopant distribution, thereby substantially avoiding any semiconductor area that may not contribute to the conductive path of the resistive structure and which may thus not unduly contribute to the overall parasitic capacitance of the resistive structure. For instance, by using a silicon base material, a polycrystalline resistive structure may be obtained which may provide enhanced flexibility in forming sophisticated transistor structures since a dedicated deposition of polycrystalline material may not be required, while at the same time enabling a high degree of compatibility with conventional polycrystalline silicon resistors. Moreover, in some illustrative aspects disclosed herein, the basic semiconductor material may be appropriately prepared to increase the basic specific resistivity thereof, for instance by incorporation of an appropriate semiconductor alloy and the like, which may nevertheless be compatible with the formation of sophisticated transistor structures, thereby enabling a reduction of the overall size of the corresponding resistive structure or providing enhanced flexibility in adjusting the desired specific resistance value by ion implantation, in situ doping and the like.

One illustrative semiconductor device disclosed herein comprises a transistor element formed in and above a crystalline semiconductor region formed in a semiconductor layer that is located above a substrate. The semiconductor device further comprises a resistor formed in a polycrystalline semiconductor region that is formed in the semiconductor layer.

One illustrative method disclosed herein relates to forming a resistive structure of a semiconductor device. The method comprises forming an amorphized semiconductor material in a resistor region of a semiconductor layer that is formed on a buried insulating layer. The method further comprises introducing a dopant species in the amorphized semiconductor material to adjust a specific resistance of the resistive structure. Finally, the method comprises annealing the amorphized semiconductor material to form a polycrystalline semiconductor region.

A further illustrative method disclosed herein relates to forming a resistive structure of a semiconductor device. The method comprises performing an ion implantation process to form an amorphized semiconductor region in a semiconductor layer, wherein the amorphized region extends to a buried insulating layer that is formed below the semiconductor layer. The method further comprises adjusting a specific resistivity of the resistive structure by providing a dopant species in the amorphized semiconductor region. Additionally, the method comprises annealing the amorphized semiconductor region to form a polycrystalline semiconductor region.

BRIEF DESCRIPTION OF THE DRAWINGS

The disclosure may be understood by reference to the following description taken in conjunction with the accompanying drawings, in which like reference numerals identify like elements, and in which.

Figure 1A:
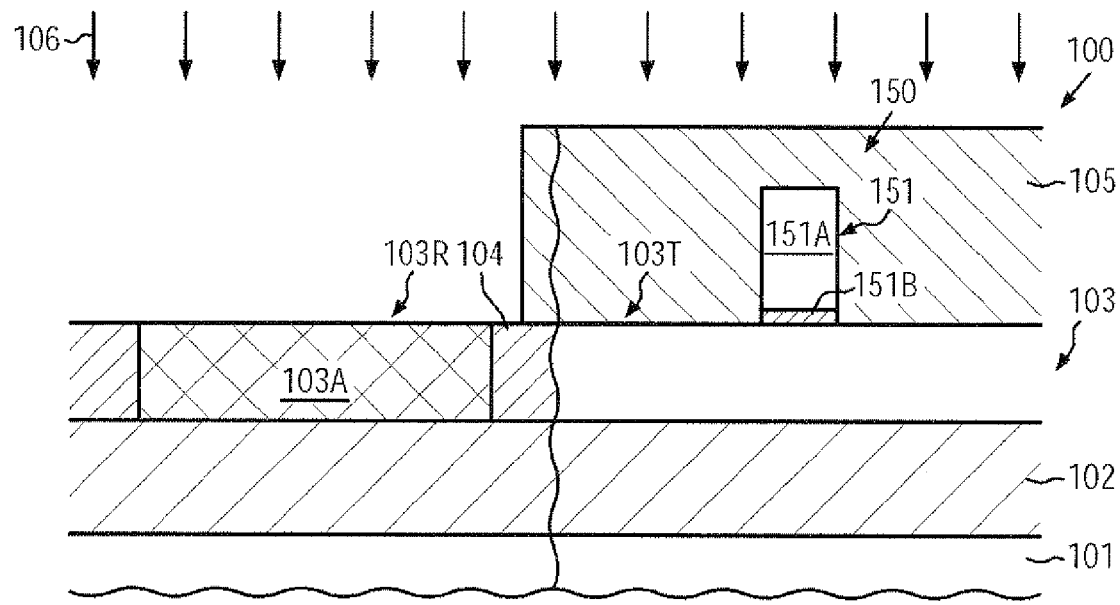
FIGS. 1a-1e schematically illustrate cross-sectional views of a semiconductor device during various manufacturing stages in forming a buried resistor on the basis of a polycrystalline material within the active semiconductor layer without requiring the deposition of a specific polycrystalline resistor material, such as polysilicon, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to semiconductor devices and methods for forming the same in which resistive structures may be formed in the basic semiconductor layer while nevertheless providing a high degree of compatibility with conventional polysilicon resistors or, in some illustrative embodiments, with polycrystalline silicon/germanium resistors and the like. The "buried" configuration may be obtained without causing an undue parasitic capacitance, while, on the other hand, by using the semiconductor layer as a base material for the polycrystalline resistive structure, enhanced flexibility in forming sophisticated transistor structures may be achieved since the deposition of a dedicated resistor material, such as polysilicon, may be avoided. To this end, in some illustrative embodiments, the crystalline structure of the basic semiconductor material in a specified resistor region may be substantially completely destroyed, for instance, by ion implantation on the basis of an appropriate species so that a substantially amorphous semiconductor material may be obtained that extends down to a buried insulating layer. Thus, in a subsequent process, an appropriate dopant concentration may be established while at the same time the substantially amorphous status of the semiconductor material may provide enhanced uniformity of the resulting dopant profile. Upon annealing the semiconductor device, the amorphized semiconductor region may "re-crystallize" to form a polycrystalline semiconductor material, such as a polysilicon material, which may provide a high degree of compatibility with conventional polysilicon resistors while at the same time reducing the value of the parasitic capacitance compared to conventional buried resistor designs. Moreover, a deposition of a dedicated material may be omitted, thereby providing enhanced flexibility in forming sophisticated gate electrode structures. In some illustrative embodiments, the buried resistive structures may be formed on the basis of a semiconductor material which may provide a reduced overall specific resistivity, for instance in the form of a silicon/germanium mixture, which may concurrently be provided in transistor active regions in order to adjust the overall charge carrier mobility, for instance by providing a desired type of strain in corresponding channel regions of the transistors. Consequently, the buried or embedded resistive structures may be formed with reduced lateral dimensions due to the increased conductivity of the semiconductor base material, thereby further contributing an increased packing density, and also the corresponding parasitic capacitance may further be reduced due to the overall reduced lateral dimensions.

FIG. 1a schematically illustrates a cross-sectional view of a semiconductor device 100, which may comprise a substrate 101 that may represent any appropriate carrier material for forming thereabove a semiconductor layer 103 that is comprised of any appropriate semiconductor material for forming therein and thereabove corresponding circuit elements, such as resistors, transistors, capacitors and the like. For example, the semiconductor layer 103 may represent a silicon-based crystalline material wherein other components, such as germanium, carbon and the like, may also be included. Furthermore, corresponding dopant species may be provided within the semiconductor layer 103 as required by the overall configuration of the semiconductor device 100. Furthermore, as illustrated, a buried insulating layer 102, for instance comprised of silicon dioxide, silicon nitride and the like, may be positioned between the substrate 101 and the semiconductor layer 103, thereby defining a silicon-on-insulator (SOI) configuration. Moreover, in the manufacturing stage shown, isolation structures 104 may be provided within the semiconductor layer 103, for instance provided in the form of trench isolation structures and the like, which may extend through the semiconductor layer 103 and to the buried insulating layer 102. Thus, the isolation structures 104 may result in a lateral isolation of corresponding "active" regions in the semiconductor layer 103, in and above which corresponding transistor elements are to be formed. For example, an active region 103T may be defined by the isolation structures 104. Furthermore, as illustrated, a resistor region 103R may be provided in the semiconductor layer 103, in and above which an appropriate resistive structure is to be formed. It should be appreciated that the corresponding lateral sizes of the active region 103T relative to the resistor region 103R may not be true to scale since the region 103R may be selected in size so as to obtain a desired resistance value depending on a specific dopant concentration to be established in a later manufacturing stage. Thus, the lateral size of the resistor region 103R may be selected to provide a desired range of resistance values, wherein a corresponding actual resistance value may be obtained by defining an actual lateral size of a resistive structure in a later manufacturing stage on the basis of a corresponding mask material, as will be described later on in more detail. Furthermore, as previously explained, the isolation structures 104, in combination with the buried insulating layer 102, may provide a substantially complete dielectric isolation of the region 103R, while, additionally, the corresponding dimensions of the isolation structures 104 may be selected so that a capacitive coupling to any adjacent resistor regions or active regions may be maintained at a desired low value.

Moreover, in the manufacturing stage shown, a gate electrode structure 151 of a transistor 150 may be formed above the active region 103T, wherein the gate electrode structure 151 may comprise a non-silicon gate electrode material 151A and a gate dielectric material 151B. As discussed above, in sophisticated semiconductor devices, at least some of the transistors provided therein may be formed on the basis of sophisticated gate electrode structures in which highly conductive metal-containing gate electrode materials may be used in combination with high-k dielectric materials, which are to be understood as dielectric materials having a dielectric constant of 10 or higher. It should be appreciated, however, that the principles disclosed herein may also be applied to semiconductor devices in which less sophisticated transistor architectures are to be used in combination with resistive structures. Furthermore, it is to be noted that in other illustrative embodiments the gate electrode structure 151 may be formed in a later manufacturing stage, depending on the overall process strategy. Furthermore, as illustrated, an implantation mask 105 may be provided to cover the active region 103T while exposing the resistor region 103R.

The semiconductor device 100 as shown in FIG. 1a may be formed on the basis of the following processes. After forming the isolation structures 104, involving lithography, etch, deposition and planarization techniques, the basic doping may be defined in the corresponding active regions 103T, which may be accomplished by well-established masking regimes in combination with corresponding implantation sequences. In some illustrative embodiments, the corresponding masking regime and the associated implantation sequences may also comprise the formation of the mask 105 and an implantation process 106, which may be performed on the basis of appropriately selected implantation parameters, i.e., dose and energy for a given implantation species, such as xenon, silicon, germanium and the like, in order to amorphize the basic material of the semiconductor layer 103 within the resistor region 103R down to the buried insulating layer 102. It should be appreciated that appropriate process parameters may be readily selected on the basis of simulation and/or experiment. Thereafter, the implantation mask 105 may be removed and the further processing may be continued, for instance, by forming the gate electrode structure 151, which may involve the deposition of an appropriate dielectric material followed by the deposition of the gate electrode material 151A. Subsequently, sophisticated patterning strategies may be applied in order to obtain the gate electrode structure 151 as illustrated in FIG. 1a. It should be appreciated that a deposition of a dedicated resistor material, such as polysilicon, may not be required, thereby providing enhanced flexibility in designing the overall process flow for forming the transistor 150. In other illustrative embodiments, as shown in FIG. 1a, the gate electrode structure 151 may be formed according to any appropriate manufacturing technique, and subsequently additional implantation processes may be performed, for instance creating crystal damage in the active regions 103T down to a specified depth in order to enhance performance of subsequent implantation steps that may be required for the main drain and source extension regions and the like. In this manufacturing stage, the mask 105 may be provided to protect the active region 103T during the implantation process 106, in which the parameters are selected so as to obtain a substantially complete amorphization of the region 103R, thereby creating an amorphized semiconductor material 103A that extends down to the buried insulating layer 102.

Figure 1B:
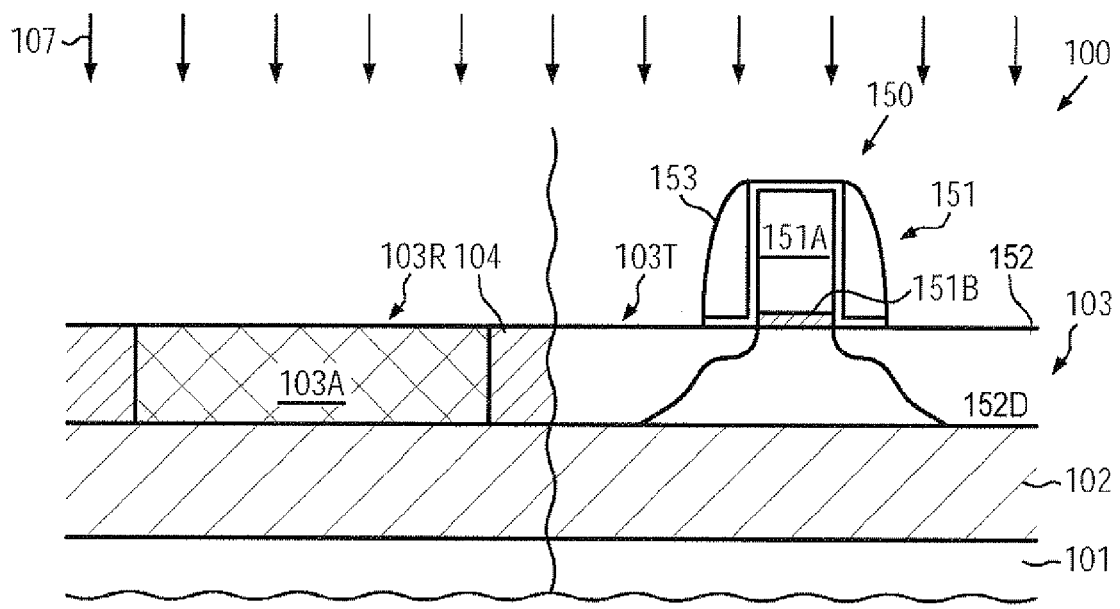

FIG. 1b schematically illustrates the semiconductor device 100 in a further advanced manufacturing stage. In the embodiment shown, a further implantation process 107 may be performed in order to introduce a desired dopant species into the amorphized semiconductor region 103A. For example, an N-type dopant species or a P-type dopant species may be incorporated into the material 103A, depending on the overall conductivity and configuration of the resistive structure to be formed in and above the region 103R. Due to the substantially amorphized state of the material 103A, a highly uniform distribution of the dopant species may be accomplished during the implantation process 107. Consequently, a moderately uniform specific resistivity of the material 103A may be achieved during the implantation process 107, which may also provide enhanced electrical performance of a corresponding resistive structure. In one illustrative embodiment, as shown in FIG. 1b, the implantation process 107 may also be used for defining deep drain and source areas 152D of corresponding drain and source regions 152. For example, if the transistor 150 represents an N-channel transistor, a corresponding N-type dopant species may be introduced during the implantation process 107, wherein corresponding implantation parameters, such as dose and energy, may be selected in order to obtain a desired dopant concentration in the regions 152D. In this case, the corresponding lateral dimensions of the resistor region 103R may have to be adapted to the specific resistance value that may be obtained on the basis of the corresponding dopant species which may be introduced with a specific dose, thereby resulting in a corresponding overall concentration. Hence, the lateral size may be selected so as to be sufficient for obtaining a desired total resistance value of a resistive structure still to be formed, wherein a final adjustment of the resistance value may be accomplished by providing a corresponding resistor mask in a later manufacturing stage. In other cases, the transistor 150 may represent a P-channel transistor, in which case a corresponding P-type dopant species may be incorporated into the deep drain and source regions 152D and thus also into the material 103A. It should be appreciated that, depending on the overall process strategy, the gate electrode structure 151, in combination with a corresponding spacer structure 153, may act as an appropriate implantation mask to establish the desired lateral dopant profile. It should be appreciated, however, that according to other strategies the gate electrode structure 151 may not be formed and may be represented by a corresponding place holder structure, depending on the overall process strategy. Furthermore, it is to be appreciated that, in other illustrative embodiments, other types of transistors, such as bipolar transistors and the like, may be formed in accordance with any appropriate manufacturing strategy, wherein, also in this case, the implantation process 107 may represent an implantation process for concurrently introducing a dopant species into a specific transistor area while also doping the amorphized material 103A. In other cases, the implantation process 107 may be performed as a separate implantation step without creating a corresponding dopant profile in any transistor areas. It should further be appreciated that, due to the amorphous state of the material 103A, a highly uniform distribution of the dopant species may be accomplished, even if the specific implantation parameters may be selected in accordance with requirements as demanded by the transistor 150. That is, due to the different behavior of amorphous material compared to a substantially crystalline material, even for given implantation parameters, a highly uniform dopant distribution may be obtained in the material 103A.

Figure 1C:
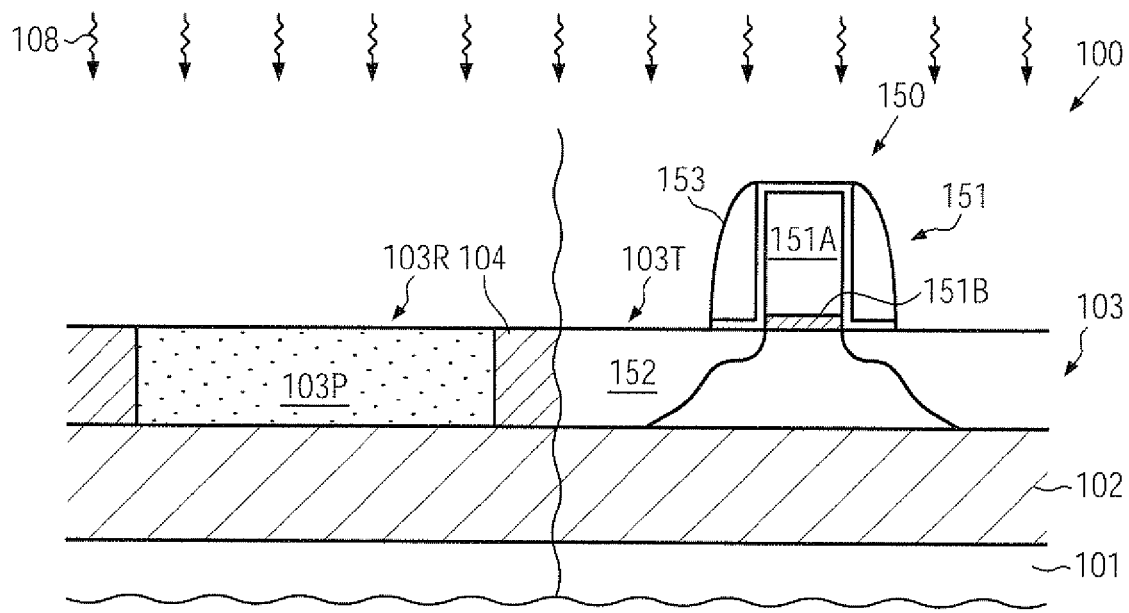

FIG. 1c schematically illustrates the semiconductor device 100 in a further advanced manufacturing stage. As illustrated, the device 100 is subjected to an anneal process 108, which, for instance, may be designed to activate dopants in the drain and source regions 152 of the transistor 150, while also re-crystallizing implantation-induced damage. At the same time, the material in the region 103R may also "re-crystallize," thereby forming a polycrystalline configuration, as indicated by 103P, which, in some illustrative embodiments, may represent a polycrystalline silicon material, when the semiconductor layer 103 is comprised of silicon. The anneal process 108 may be performed on the basis of any appropriate technique, such as flashlight-based processes, laser-based techniques, rapid thermal anneal processes and the like, as may be required in view of adjusting the final dopant profile in the transistor 150, for instance by adjusting a certain degree of dopant diffusion and the like. On the other hand, due to the highly uniform distribution of the dopant species within the region 103R, the corresponding anneal parameters may be less critical in view of the resulting specific resistivity.

Figure 1D:
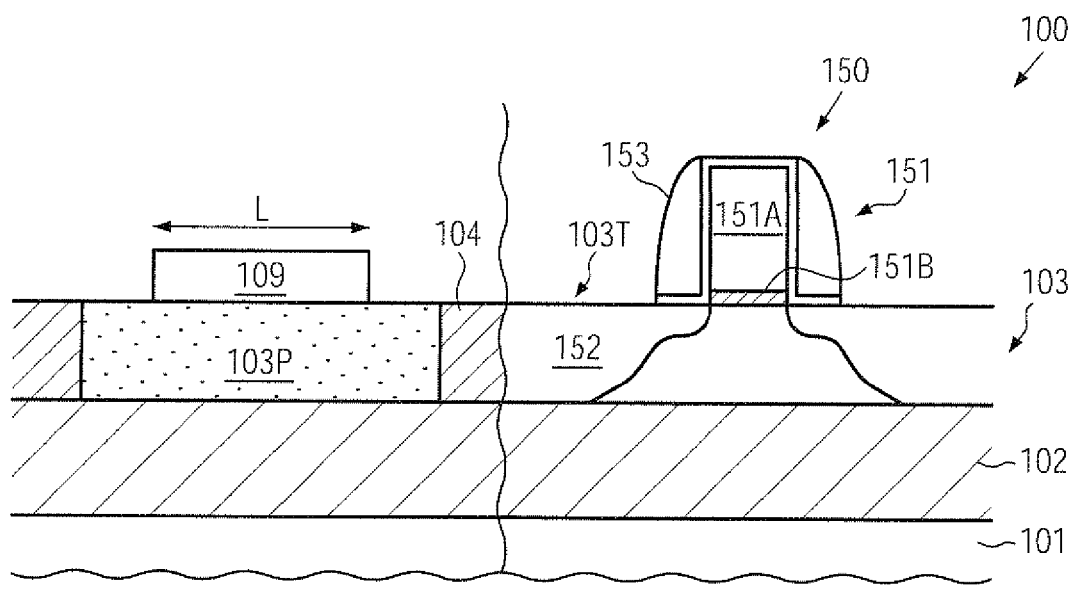

FIG. 1d schematically illustrates the semiconductor device 100 in a further advanced manufacturing stage. As illustrated, a hard mask material 109 is formed above the region 103R in order to define the lateral dimensions of the actual resistor in the polycrystalline semiconductor material 103P. That is, due to the preceding processing, the material 103P has a corresponding specific resistivity, wherein a corresponding total resistance value may then be adjusted on the basis of appropriately determining the lateral dimension, as indicated by "L." For example, the region 103R may have a given extension in a "width" direction, which is to be understood as a direction perpendicular to the drawing plane of FIG. 1d. Thus, for a given corresponding width of the region 103R, and for a given specific resistivity of the material 103P, the total resistance value may be adjusted on the basis of the mask 109, i.e., by selecting the lateral dimension L that corresponds to a direction of current flow that is to be established upon operation of the semiconductor device 100. In the embodiment shown, the hard mask 109 may be provided after completing the basic transistor configuration while in other cases the hard mask 109 may be provided at any appropriate manufacturing stage, depending on the overall process strategy. For example, the hard mask 109 may be provided in the form of a silicon nitride material, a silicon dioxide material and the like, wherein two or more of the appropriate materials may also be used, for instance, in the form of an etch stop material and the actual hard mask material. For instance, an etch stop liner, such as a silicon dioxide material, may be formed, followed by the deposition of the hard mask material, for instance in the form of a silicon nitride material, which may then be appropriately patterned by lithography and anisotropic etch techniques.

Figure 1E:
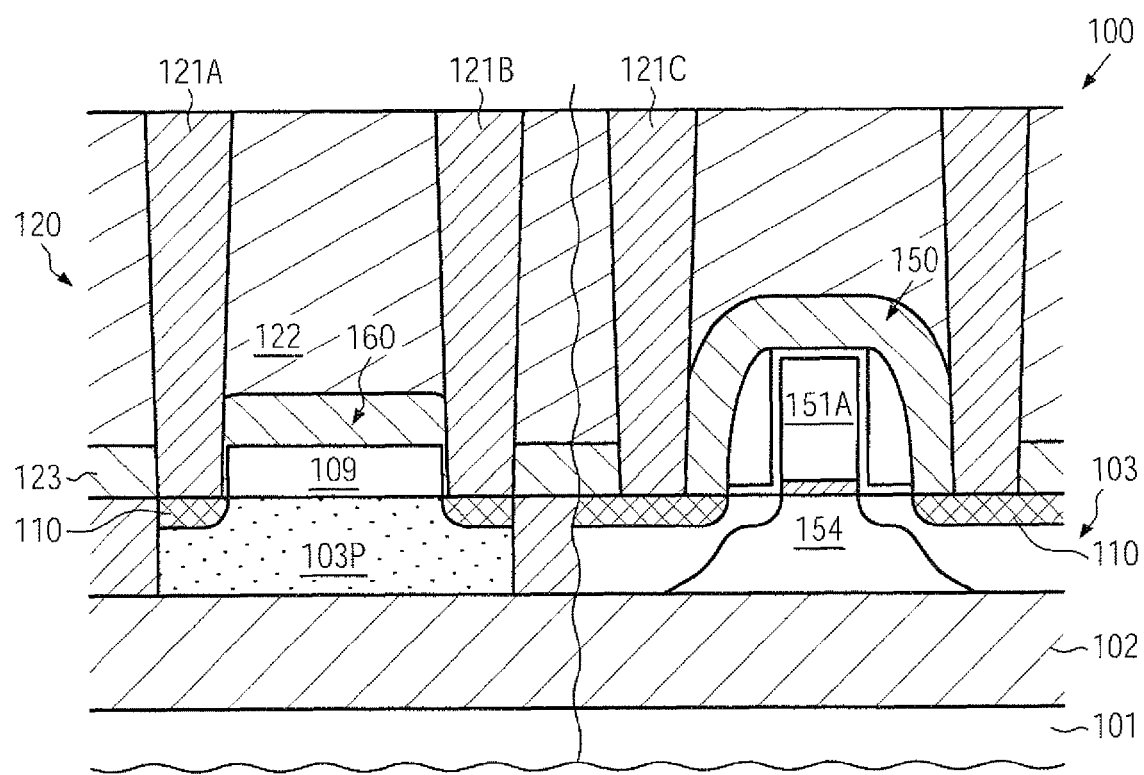

FIG. 1e schematically illustrates the semiconductor device 100 in a further advanced manufacturing stage. As illustrated, the semiconductor device 100 comprises the transistor 150 in a substantially completed configuration and comprises also a resistive structure 160 comprising the polycrystalline semiconductor material 103P, the hard mask 109 and corresponding contact areas 110, which may be provided in the form of highly conductive metal-containing materials, such as a metal silicide, when the polycrystalline material 103P comprises a significant fraction of silicon material. Similarly, the transistor 150 may also comprise corresponding contact areas 110, for instance comprised of a metal silicide. Furthermore, the semiconductor device 100 may comprise a contact level 120, which may be understood as a level connecting any circuit elements formed in and above the semiconductor layer 103 to a metallization system (not shown) of the semiconductor device 100. For example, the contact level 120 may comprise corresponding dielectric materials, such as an interlayer dielectric material 122, which may be provided in the form of a silicon dioxide material and the like, possibly in combination with an etch stop material 123, such as a silicon nitride material and the like. Moreover, corresponding contact elements 121A, 121B, 121C may be provided to connect to the corresponding contact areas 110 of the resistive structure 160 and the transistor 150. The contact elements 121A, 121B, 121C may be comprised of any appropriate metal, such as tungsten, copper, aluminum and the like, possibly in combination with an appropriate conductive barrier material (not shown).

The semiconductor device 100 as shown inure FIG. 1e may be formed on the basis of well-established process techniques which may, for instance, include the deposition of any appropriate refractory metal, such as nickel, cobalt, platinum, or a combination thereof and the like. Thereafter, a heat treatment may be performed to initiate a chemical reaction for creating a metal silicide, followed by the removal of any non-reacted metal material. Thereafter, any further heat treatment may be performed, if required, for instance for thermally stabilizing the resulting material in the contact areas 110. Next, the etch stop material 123 may be deposited, for instance on the basis of well-established process techniques, wherein, in some illustrative embodiments, at least a portion of the material 123 may be provided in a highly stressed state to enhance performance of one or more transistors 150, since, typically, in silicon-based semiconductor devices, a corresponding strain generated in a channel region 154 may result in a modified charge carrier mobility, which may thus result in a modified drive current capability. Hence, by generating a strain component, which may result in an increase of charge carrier mobility, performance of the corresponding transistor 150 may be enhanced. For example, if the transistor 150 may represent an N-channel transistor, typically, a tensile strain in the channel region 154 may increase electron mobility, which may be accomplished by, for instance, providing the dielectric material 123 with a highly tensile stressed state above the transistor 150. Similarly, a compressive stress in the channel region 154 of a P-channel transistor for a standard crystallographic configuration of the basic semiconductor layer 103 may result in an increased hole mobility. Thus, after providing the material 123, possibly in a highly stressed state adapted to the various transistor types, the interlayer dielectric material 122 may be deposited by well-established techniques, followed by any planarization processes in order to obtain a substantially planar surface topography, based on which a corresponding patterning sequence may be performed in order to obtain openings for the contact elements 121A, 121B, 121C. Thereafter, the openings may be filled with an appropriate metal and finally any excess material may be removed, thereby obtaining the structure as shown in FIG. 1e. Thereafter, one or more metallization layers may be formed in accordance with well-established process techniques.

Consequently, the resistive structure 160 may be provided on the basis of the polycrystalline semiconductor material 103P, such as a polysilicon material, without requiring the deposition of a corresponding polycrystalline semiconductor material above the semiconductor layer 103. Moreover, the parasitic capacitance of the structure 160 may be maintained at a low level due to the provision of the isolation structures 104 and by providing a high degree of uniformity of the material 103P. Thus, a high degree of flexibility may be accomplished in forming other circuit elements, such as transistors 150, which in some illustrative embodiments may be provided in the form of sophisticated transistor elements including the gate electrode structure 151 based on a non-silicon electrode material.

Figure 1F:
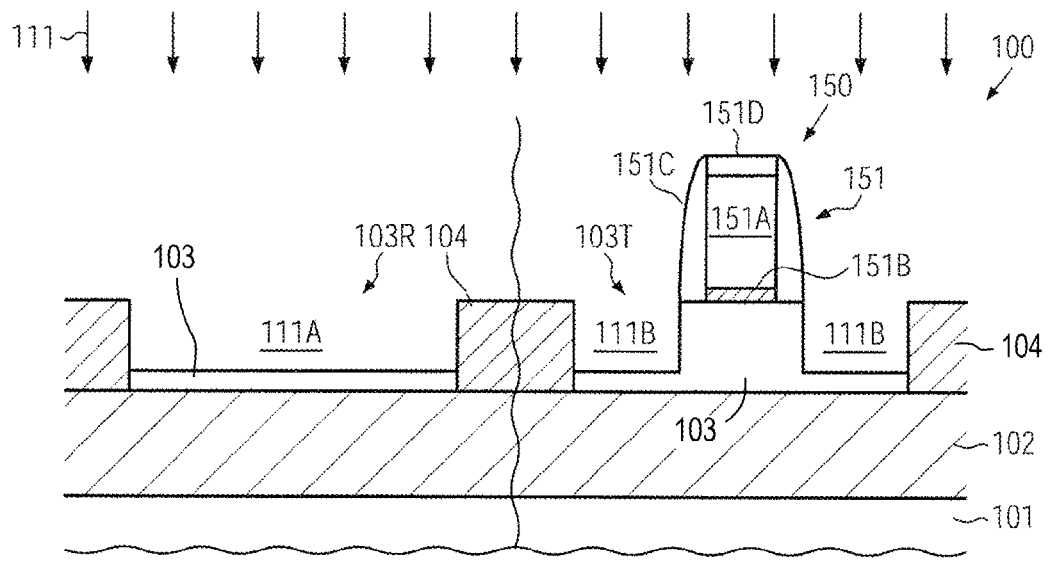
FIGS. 1f-1g schematically illustrate cross-sectional views of the semiconductor device according to further illustrative embodiments in which the basic semiconductor material of the semiconductor layer may be "prepared" so as to obtain an increased basic specific resistivity by providing a semiconductor alloy while maintaining a high degree of compatibility with a manufacturing flow for forming strained channel regions of sophisticated transistors.
Figure 1G:
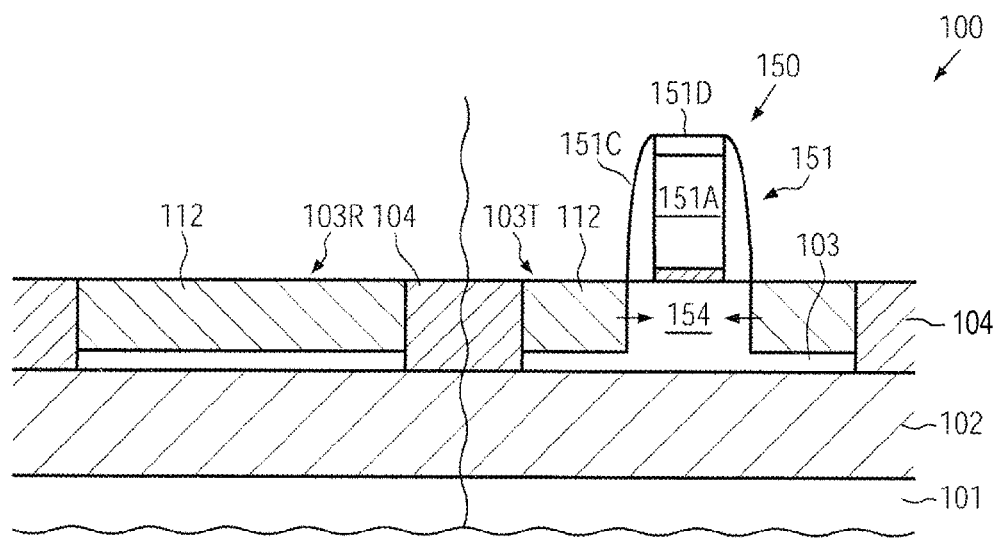

With reference to FIGS. 1f-1g further illustrative embodiments will now be described in which the resistive structure may be formed on the basis of a semiconductor alloy, which may additionally be used for enhancing transistor characteristics by creating a corresponding strain in the channel region of the transistor.

FIG. 1f schematically illustrates the semiconductor device 100 when exposed to an etch ambient 111 designed to form corresponding cavities 111A, 111B in the resistor region 103R and in the active region 103T adjacent to the gate electrode structure 151. Depending on the configuration of the gate electrode material 151A, respective sidewall spacers 151C and a cap layer 151D may be provided in order to encapsulate a gate electrode material 151A. Consequently, the cavities 111B may be formed with a corresponding offset to the gate electrode material 151A, as defined by the spacer structure 151C and the overall characteristics of the etch process 111. Furthermore, the cavities 111B may not completely extend down to the buried insulating layer 102 to maintain a portion of the initial semiconductor layer 103 that may act as a growth template during a subsequent epitaxial growth process for filling the cavities 111B, 111A with an appropriate semiconductor alloy.

The semiconductor device 100 as shown in FIG. 1f may be formed on the basis of well-established process techniques. For instance, the gate electrode structure 151 may be formed in accordance with any appropriate manufacturing technique, for instance by providing well-established materials, such as polycrystalline silicon and the like, while, in other applications, sophisticated metal-containing materials may be used. Furthermore, if required, an appropriate material for the cap layer 151D may be deposited and may be patterned together with the gate electrode material 151A. Thereafter, the spacer structure 151C may be formed, if required, by depositing an appropriate spacer material, such as silicon nitride, possibly in combination with an etch stop material and patterning the spacer material 151C by well-established anisotropic etch techniques. It should be appreciated that other active regions 103T, in which the cavities 111B may not be required, may be covered by a resist mask, when patterning the corresponding spacer layer used for forming the spacer structure 151C. Thereafter, the etch process 111 may be performed on the basis of well-established etch techniques.

In some illustrative embodiments, after forming the cavities 111A, 111B, the active region 103T may be masked, for instance by a resist mask, and the remaining semiconductor material of the layer 103 in the region 103R may be amorphized by performing a corresponding implantation process, as is also previously described. In other illustrative embodiments the further processing may be continued without performing the corresponding implantation process.

FIG. 1g schematically illustrates the semiconductor device 100 in a further advanced manufacturing stage. As shown, a semiconductor alloy 112 may be formed in the cavities 111A, 111B, which may be accomplished by performing a selective epitaxial growth process, thereby depositing a desired semiconductor material on exposed portions of the layer 103. In one illustrative embodiment, the semiconductor alloy 112 may be provided in the form of a silicon/germanium alloy, which may be grown in a highly strained state within the cavities 111A, 111B due to the lattice mismatch between the silicon/germanium material and the template material of the layer 103. Thus, a compressive strain component may be obtained in the channel region 154 of the transistor 150. Hence, by providing the semiconductor alloy 112 as a strain-inducing source in the transistor 150, the performance thereof may be significantly enhanced.

As previously indicated, in some illustrative embodiments, the material 103 in the resistor region 103R may be amorphized prior to the selective growth of the material 112, so that, in this case, the material 112 may be formed in a substantially amorphous state without generating a strain in the region 103R. In other illustrative embodiments, as shown, the material 112 may be grown in a substantially crystalline state due to the presence of the template material 103 wherein the corresponding crystalline state may be destroyed by performing an ion implantation process, as is previously described with reference to FIG. 1a, when referring to the implantation process 106. Thus, also in this case, an amorphized material may be obtained in the region 103R. Thereafter, in some illustrative embodiments, the further processing may be continued, as is also previously described, in order to form the resistive structure 160 (FIG. 1e), wherein the silicon/germanium material may provide an overall increased specific conductivity, thereby enabling an enhanced flexibility in designing the resistance values of the resistive structure 160, as is also previously explained. For instance, reduced lateral dimensions may be used, thereby reducing any parasitic capacitance while at the same time providing an increased packing density. Furthermore, in some illustrative embodiments, a dopant species may be incorporated during the selective epitaxial growth process for forming the material 112, thereby also providing increased flexibility in designing the overall resistance value in the region 103R. It should be appreciated that the incorporation of the dopant species into the material 112 may nevertheless result in a substantially uniform dopant distribution after substantially amorphizing the region 103R and after performing a corresponding anneal process.

Consequently, an embedded or buried resistive structure may be accomplished on the basis of a semiconductor material having an increased specific conductivity compared to silicon material, while at the same time providing a high degree of compatibility with sophisticated manufacturing techniques in which the semiconductor alloy may additionally represent a strain-inducing source in at least one type of transistors.

As a result, the present disclosure provides semiconductor devices and techniques in which a resistive structure may be embedded into a basic semiconductor layer, while nevertheless providing a high degree of device uniformity of the resistive structure and also maintaining a high degree of compatibility with conventional polycrystalline resistors. Thus, by using the embedded resistive structure, enhanced flexibility in forming sophisticated gate electrode structures of transistors may be achieved in combination with high performance of the resistors due to a reduced parasitic capacitance. In some illustrative embodiments, a semiconductor alloy may be used as the basis resistor material, which may be accomplished with a high degree of compatibility with corresponding manufacturing techniques for providing an embedded strain-inducing semiconductor material in sophisticated transistor architectures.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a resistive structure of a semiconductor device, the method comprising:
   forming an isolation structure in a semiconductor layer formed on a buried insulating layer, said isolation structure laterally defining a resistor region in said semiconductor layer;
   forming a transistor in and above a crystalline active region that is positioned in said semiconductor layer;
   after forming said isolation structure, forming an amorphized semiconductor material in said resistor region;
   after forming said amorphized semiconductor material in said resistor region, introducing a dopant species into said amorphized semiconductor material to adjust a specific resistance of said resistive structure, wherein said dopant species is introduced when forming drain and source regions of said transistor; and
   annealing said amorphized semiconductor material to form a polycrystalline semiconductor region.

2. The method of claim 1, further comprising forming a gate electrode material of said transistor using a non-silicon electrode material.

3. The method of claim 1, further comprising forming first cavities in said crystalline active region adjacent to a gate electrode structure of said transistor and forming a second cavity in said resistor region and forming a silicon/germanium alloy in said first and second cavities prior to forming said amorphized semiconductor material.

4. A method of forming a resistive structure of a semiconductor device, the method comprising:
   forming an isolation structure in a semiconductor layer, said isolation structure laterally defining an isolated semiconductor region in said semiconductor layer;
   forming a semiconductor alloy in said semiconductor layer;
   after forming said semiconductor alloy in said semiconductor layer, performing an ion implantation process to amorphize said isolated semiconductor region, said amorphized semiconductor region extending to a buried insulating layer formed below said semiconductor layer;
   after amorphizing said isolated semiconductor region, adjusting a specific resistivity of said resistive structure by introducing a dopant species into said amorphized semiconductor region, wherein said dopant species is introduced at least partially in an epitaxial growth process used to form said semiconductor alloy; and
   annealing said amorphized semiconductor region to form a polycrystalline semiconductor region.

5. The method of claim 4, further comprising forming a gate electrode structure of a transistor above said semiconductor layer, wherein said gate electrode structure comprises a non-silicon electrode material.

6. The method of claim 4, wherein said amorphized semiconductor region is comprised of silicon.

7. The method of claim 4, wherein said semiconductor alloy is formed in drain and source areas of a transistor.

8. The method of claim 4, wherein forming said isolation structure comprises forming said isolation structure to contact said buried insulating layer.

9. The method of claim 1, wherein forming said amorphized semiconductor region comprises forming a cavity in a resistor region of said semiconductor device by removing an upper portion of said semiconductor layer, performing said ion implantation process to amorphize a remaining lower portion of said semiconductor layer above said buried insulating layer, and epitaxially forming a semiconductor alloy in said cavity.

10. A method of forming a resistive structure of a semiconductor device, the method comprising:
  forming an amorphized semiconductor material in a resistor region of a semiconductor layer formed on a buried insulating layer;
  forming a transistor element in and above a crystalline active region that is positioned in said semiconductor layer and separated from said resistor region;
  introducing a dopant species in said amorphized semiconductor material to adjust a specific resistance of said resistive structure, wherein said dopant species is introduced when forming drain and source regions of said transistor; and
  annealing said amorphized semiconductor material to form a polycrystalline semiconductor region.

11. A method of forming a resistive structure of a semiconductor device, the method comprising:
  forming a resistor region and a crystalline active region in a semiconductor layer that is formed on a buried insulating layer;
  forming a transistor element in and above said crystalline active region;
  forming first cavities in said crystalline active region adjacent to a gate electrode structure of said transistor;
  forming a second cavity in said resistor region;
  forming a silicon/germanium alloy in said first cavities and in said second cavity;
  after forming said silicon/germanium alloy, forming an amorphized semiconductor material in said resistor region;
  introducing a dopant species in said amorphized semiconductor material to adjust a specific resistance of said resistive structure; and
  annealing said amorphized semiconductor material to form a polycrystalline semiconductor region.

12. A method of forming a resistive structure of a semiconductor device, the method comprising:
  performing an epitaxial growth process to form a semiconductor alloy in a semiconductor layer;
  after forming said semiconductor alloy, performing an ion implantation process to form an amorphized semiconductor region in said semiconductor layer, said amorphized semiconductor region extending to a buried insulating layer formed below said semiconductor layer;
  adjusting a specific resistivity of said resistive structure by providing a dopant species in said amorphized semiconductor region, wherein said dopant species is introduced at least partially during said epitaxial growth process; and
  annealing said amorphized semiconductor region to form a polycrystalline semiconductor region.

13. The method of claim 12, wherein forming said semiconductor alloy comprising forming a cavity in a resistor region formed in said semiconductor layer and forming said semiconductor alloy in said cavity during said epitaxial growth process.

14. The method of claim 1, wherein forming said amorphized semiconductor material comprises:
  forming a cavity in said resistor region, wherein forming said cavity comprises removing an upper portion of said semiconductor layer from above said buried insulating layer;
  performing an ion implantation process to amorphize a lower portion of said semiconductor layer remaining above said buried insulating layer; and
  epitaxially forming a semiconductor alloy in said cavity.

15. The method of claim 1, wherein said dopant species is introduced into said amorphized semiconductor material during an implantation process.

16. A method of forming a resistive structure of a semiconductor device, the method comprising:
  forming an isolation structure in a semiconductor layer formed on a buried insulating layer, said isolation structure laterally defining a resistor region in said semiconductor layer;
  forming a transistor element in and above a crystalline active region that is positioned in said semiconductor layer;
  forming first cavities in said crystalline active region adjacent to a gate electrode structure of said transistor;
  forming a second cavity in said resistor region;
  forming a silicon/germanium alloy in said first and second cavities;
  after forming said isolation structure and after forming said silicon/germanium alloy in said first and second cavities, forming an amorphized semiconductor material in said resistor region;
  after forming said amorphized semiconductor material in said resistor region, introducing a dopant species into said amorphized semiconductor material to adjust a specific resistance of said resistive structure; and
  annealing said amorphized semiconductor material to form a polycrystalline semiconductor region.

* * * * *